United States Patent [19]

Coffield

[11] Patent Number: 4,641,087

[45] Date of Patent: Feb. 3, 1987

[54] PHASE COMPARATOR APPARATUS AND METHOD

[75] Inventor: Frederick E. Coffield, Livermore, Calif.

[73] Assignee: The United States of America as represented by the Department of Energy, Washington, D.C.

[21] Appl. No.: 697,296

[22] Filed: Feb. 1, 1985

[51] Int. Cl.⁴ .......................................... G01R 25/00
[52] U.S. Cl. ................................ 324/83 R; 324/83 D; 328/134
[58] Field of Search ...................... 328/133, 134, 206; 307/525, 526; 324/83 R, 83 D, 86, 83 A, 84, 77 H; 331/11, 12, 25, 27

[56] References Cited

U.S. PATENT DOCUMENTS

| | | | |
|---|---|---|---|
| 3,555,194 | 1/1971 | Goto | 331/12 |
| 3,600,690 | 8/1971 | White | 328/133 |
| 3,947,775 | 3/1976 | Thiebaut | 328/133 |
| 4,184,122 | 1/1980 | Clark et al. | 328/133 |
| 4,228,370 | 10/1980 | Milburn, Jr. | 307/559 |
| 4,246,497 | 1/1981 | Lawson et al. | 324/83 A |
| 4,333,055 | 6/1982 | Crackel | 307/514 |
| 4,500,852 | 2/1985 | Phillips | 328/134 |

Primary Examiner—Michael J. Tokar
Assistant Examiner—Kevin D. O'Shea
Attorney, Agent, or Firm—Henry P. Sartorio; Clifton E. Clouse, Jr.; Judson R. Hightower

[57] ABSTRACT

The phase change to be measured is multiply measured at artificially increased and decreased values and then averaged to result in greater accuracy. Delayed versions of the reference and input signals are compared in dual channels to the undelayed input signal and the undelayed reference signal, respectively. Resulting time-lengthened and time-shortened phase measurement signals from the dual comparator channels are algebraically combined to provide an analog output signal having an average magnitude accurately proportional to the true phase difference between the undelayed reference and the undelayed input signals. Increased linearity/reproducibility results where relatively high frequency signals (e.g., up to 70 MHz or more) are to be phase compared. An optional voltage clamp on the comparator channel outputs further improves linearity/reproducibility where very small phase differences are being measured.

21 Claims, 7 Drawing Figures

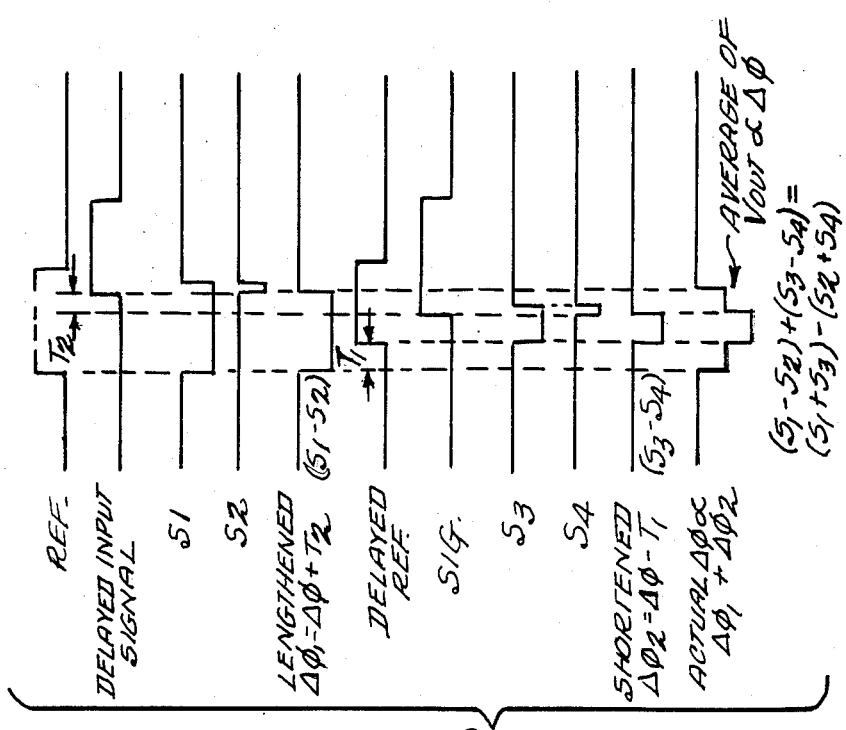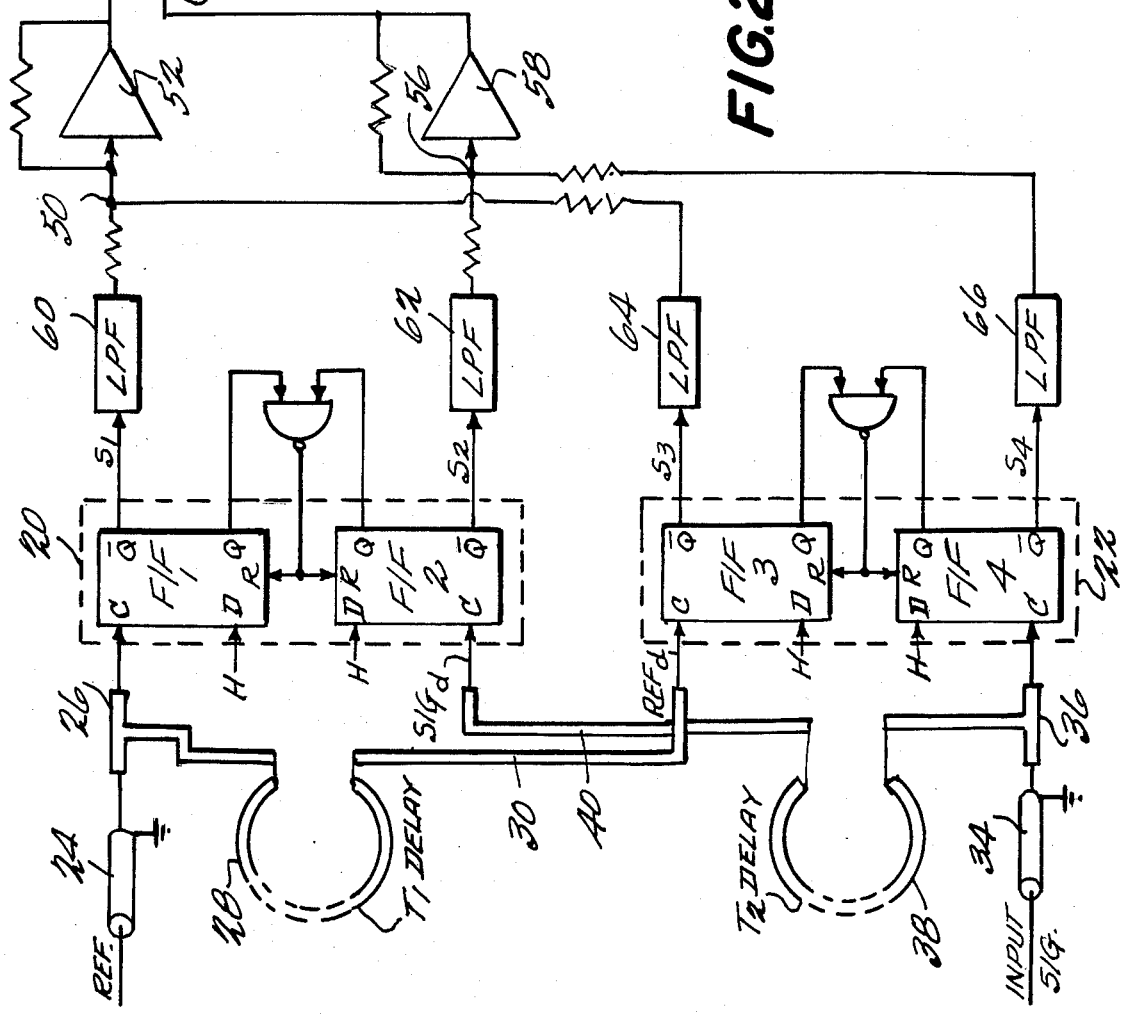

PHASE COMPARATOR APPARATUS AND METHOD

This invention was made in the course of or under prime contract #W-7405-ENG-48 between the U.S. Department of Energy and the University of California for the operation of Lawrence Livermore National Laboratory.

BACKGROUND OF THE INVENTION

This invention relates generally to the field of measuring phase differences between electrical signals. The apparatus and method of this invention is particularly useful where phase differences are to be measured between relatively high frequency signals (e.g., up to 70 MHz or more) and/or where relatively small phase differences are to be measured.

As those in the art will appreciate, there are a wide variety of useful applications for phase measurement circuits/methods. Although this invention is of general applicability, the exemplary embodiment of this invention finds especially useful application for interferometer measurements made in plasma fusion devices (e.g., for measuring the line integral of electron density in the plasma). Such interferometers typically use very high intermediate frequencies (e.g., on the order of 10 to 70 MHz) and therefore the phase comparison circuitry should be a high speed circuit with a linear transfer characteristic so as to accurately differentiate between small fractions of interference fringes.

If the relative phase difference between two signals is to be measured with high resolution, then it is necessary that the system exhibit substantial linearity such that changes in relative phase produce a directly proportional and reproducible change in the overall output signal from the phase comparator. If non-linearity is present in the phase comparator, then the exact amount of phase change responsible for producing a given output signal is necessarily less accurately known so that less overall accuracy in the phase measurement is achieved.

Typical prior art circuits used in such interferometer applications unfortunately generally produce non-linear overall transfer functions at higher frequencies. Unfortunately, typical prior art phase comparator circuits used in the past for interferometry fail to resolve small phase differences, or are exceptionally non-linear. At least in part, such non-linearities are enhanced when only small phase differences are involved because the response/rise time of the pulses being output by the comparator have sloped, rounded or otherwise distorted leading/trailing edges (with respect to the theoretically perfect square waveshape). Since, in typical phase comparators, the output signal represents an integrated average of such pulses, even small distortions in the pulse shapes of relatively small pulses necessarily produces inaccuracy in the final averaged output signal.

Now, however, I have discovered a novel form of dual channel comparator method/apparatus which provides a substantial improvement when signals of relatively high frequency are to be compared and/or when signals having relatively small phase differences are to be compared.

SUMMARY OF THE INVENTION

In brief summary, the presently preferred exemplary embodiment multiply measures the phase difference and averages the results to produce a composite output having improved accuracy. For example, it utilizes a time-delayed version of the reference signal and a time-delayed version of an input signal for which a relative phase measurement is to be made. A first phase-comparator channel compares an undelayed reference signal with a delayed version of the input signal while the second phase-comparator channel compares the delayed version of the reference signal with the undelayed input signal.

In effect, one channel is thus caused to observe a phase difference which is somewhat lengthened from the actual value (e.g., by a predetermined time delay) while the other channel is forced to provide a phase measurement which is somewhat shortened from the actual value (e.g., also by the same predetermined time delay in the preferred exemplary embodiment). The average value of the combined dual channel phase comparator circuits is, however, still proportional to the actual phase difference to be measured. Accordingly, suitable algebraic combination of the signals from the dual phase-comparator channels will provide the requisite output signal (e.g., a low pass filtered composite analog signal) more accurately related to the actual phase where higher frequency signals are being compared. The polarity of the resulting output signal also indicates the relative direction of the phase difference between the signals being compared.

By making a greater number of individual phase measurements, an improved signal-to-noise ratio can be realized which is approximately proportional to the square root of the number of such multiple measurements (e.g., an improvement of about 1.4 in the exemplary embodiment where N=2) as will be appreciated by those in the art. Further improved accuracy is also obtained due to the fact that random measurement perturbations due to numerous potentially varying signal/circuit parameters are averaged together and thus, at least in part, cancelled.

To even further improve linearity/reproducibility of phase measurements when only very small phase differences are being measured, a bi-polar voltage clamp is preferably employed at the logic outputs of each dual channel phase-comparator so as to "square up" the rather short logic pulses representative of the rather small measured phase difference which might otherwise have degraded leading/trailing edges (e.g., sloped, rounded, etc.) thus leading to overall inaccuracy in the final averaged output signal.

In the presently preferred exemplary embodiment, the intermediate outputs from conventional phase comparators in each channel have been interconnected with the intermediate outputs from the other channel so as to streamline the algebraic summation/difference circuits (e.g., summing nodes, operational amplifiers, difference amplifiers, etc.). This interleaved connection reduces the quantity of required hardware/processing circuits while simultaneously minimizing the sources of possible inherent error.

These as well as other objects and advantages of this invention will be more completely understood by careful study of the following detailed description of the presently preferred exemplary embodiment of this invention taken in conjunction with the accompanying drawings, of which:

BRIEF DESCRIPTION OF THE DRAWINGS

FIG. 2A is a schematic diagram of an exemplary embodiment of the present plural channel phase comparator;

FIG. 2B is a signal waveform diagram useful in explaining the operation of the exemplary circuit shown in FIG. 2A;

DETAILED DESCRIPTION OF A PREFERRED EMBODIMENT

Figure 1A:
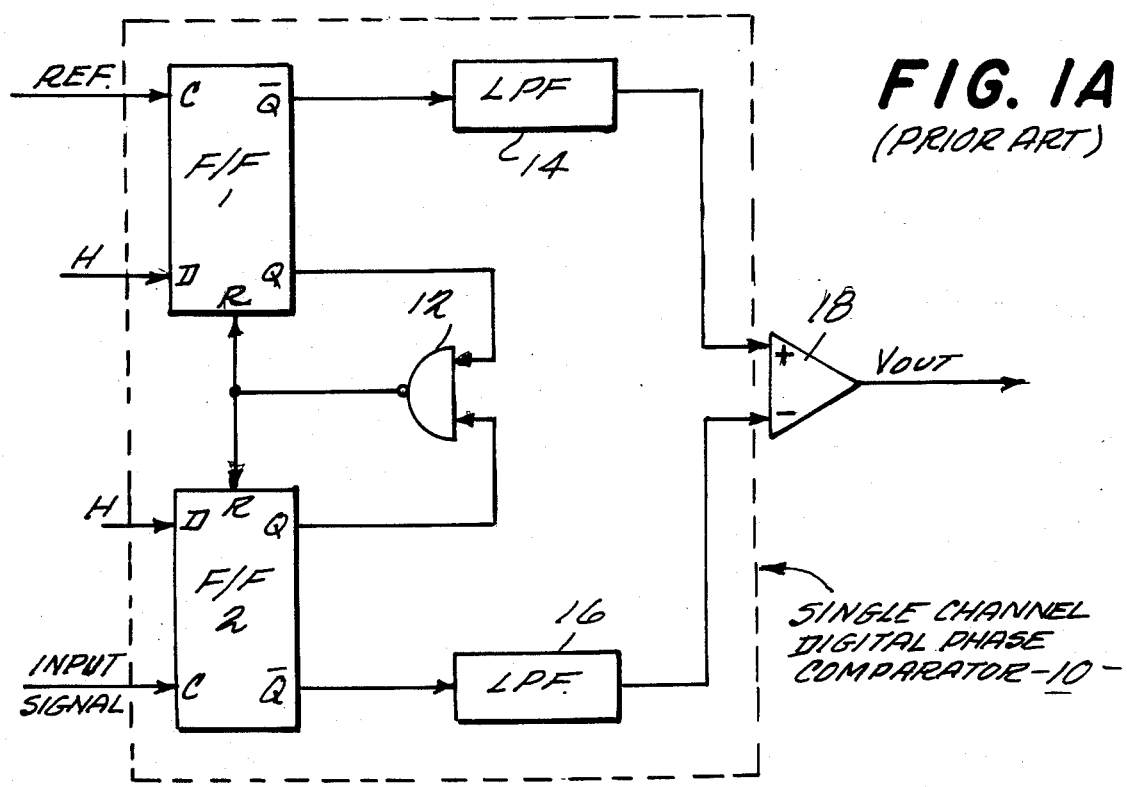
FIG. 1A is a schematic diagram of a typical prior art single channel digital phase comparator.
Figure 1B:
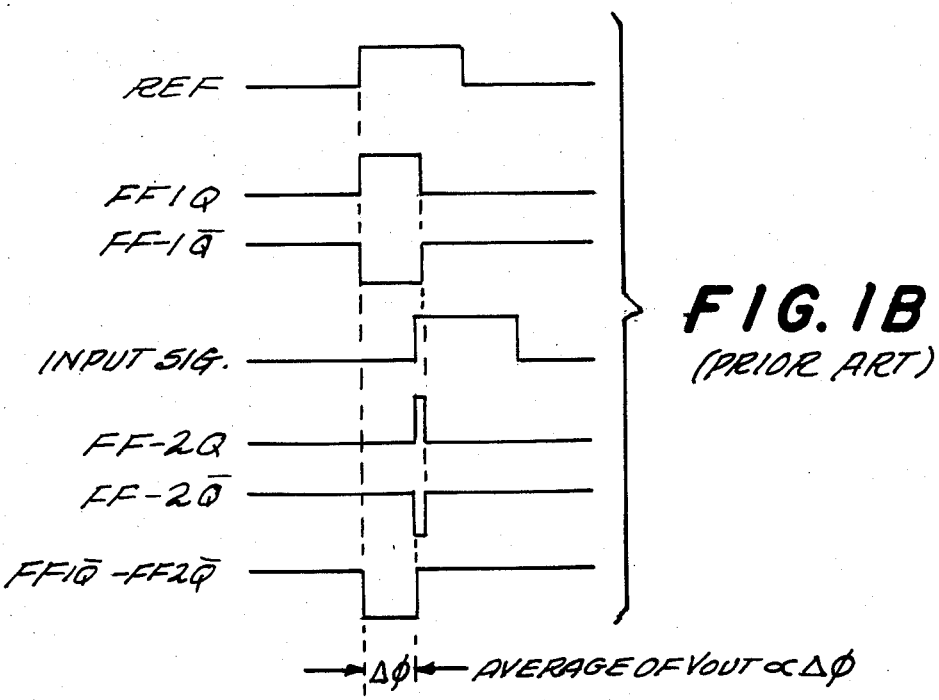
FIG. 1B is a signal waveform diagram useful in understanding the operation of the prior art circuit shown in FIG. 1A.

A typical prior art single channel digital phase comparator 10 and its operation are depicted at FIGS. 1A and 1B. Throughout the discussion of this prior art circuit and of the exemplary embodiment it will be assumed that the reference signal and the input signal being phase compared therewith are square-shaped waveforms. As those in the art will appreciate, the actual raw signals to be compared may often be sinusoids (or other waveshapes). However, it is typical (and preferred for use with this invention) to "square up" such raw signals. For example, zero-crossing detectors, level detectors, high gain saturated amplifiers and/or other techniques well known in the art can be used for such purposes as will be readily appreciated by those in the art.

In the typical prior art comparator 10 of FIG. 1A, a pair of D-type flip-flops FF1 and FF2 are employed. Their D inputs are tied to a "high" logic level signal H so as to maintain both flip-flops enabled to transition upon receipt of a positive-going leading edge at their respective clocking or triggering inputs. For purposes of explanation, it will be assumed that both flip-flops FF1 and FF2 initially reside in a "reset" state where their Q outputs are "low" and their $\overline{Q}$ outputs are "high".

The input reference signal REF is connected to the clocking input of flip-flop FF1. Accordingly, when the next leading edge of REF occurs, then flip-flop FF1 will transition and reset NAND gate 12 will be enabled. Subsequently, when the corresponding leading edge of the input signal SIG occurs, it is connected to clock flip-flop FF2 thus "setting" it. However, since the reset NAND gate 12 has already been primed, it will substantially immediately reset both flip-flops FF1 and FF2. (The relative width of the logic outputs from flip-flop FF2 has been exaggerated in FIG. 1B for purposes of illustration.)

As a result, if one takes the difference between the $\overline{Q}$ ouputs of FF1 and FF2, then one is provided with a pulse having a width proportional to the time difference between the reference signal REF and the input signal SIG (i.e., proportional to their phase difference). In actual practice, the $\overline{Q}$ logic outputs of flip-flops FF1 and FF2 are low pass filtered at 14, 16 before being differenced in operational amplifier 18 to provide an output analog voltage signal having an average magnitude proportional to the measured phase difference between REF and SIG. As should be appreciated, the polarity of the analog output voltage will represent the relative direction of the measured phase difference.

In the exemplary embodiment of FIG. 2A, it will be observed that flip-flops FF1 and FF2 correspond to the similarly labelled flip-flops in FIG. 1A and provide a first channel digital phase comparator 20 having intermediate outputs S1 and S2 corresponding to the $\overline{Q}$ logic outputs from FF1 and FF2.

Similarly, a second channel digital phase comparator 22 is provided and comprises analogously connected flip-flops FF3 and FF4 to provide intermediate output signals S3 and S4 corresponding to the $\overline{Q}$ logic outputs of flip-flops FF3 and FF4.

However, as will be observed from FIGS. 2A and 2B, the input to the first channel digital phase comparator 20 comprises an undelayed version of the reference signal REF and a delayed version of the input signal $SIG_d$ (e.g., delayed by T2). At the same time, the inputs to the second channel digital phase comparator 22 comprise a delayed version of the reference signal $REF_d$ (e.g., delayed by T1 which, in the preferred exemplary embodiment is substantially equal to T2) and an undelayed version of the input signal SIG.

Typically, the undelayed reference signal REF might be supplied through coaxial cable 24. Although the transmission medium is not critical, in the exemplary embodiment, this undelayed REF signal is then passed to the clocking input of FF1 via microstrip transmission line 26 and, via a T-connection in the microstrip line, to an appropriate length of coaxial cable 28 sufficient to produce the T1 time delay before passing on through microstrip transmission line 30 to the clocking input of flip-flop FF3.

Similarly, the undelayed input signal SIG might be provided by a conventional coaxial cable 34. Again, although the transmission medium is not critical, in the preferred embodiment this signal passes through microstrip transmission line 36 directly to the clocking input of flip-flop FF4 and, via a T-connection in the microstrip transmission line, to a suitable length of coaxial cable 38 (e.g., long enough to introduce the desired time delay T2) whereupon it passes back along microstrip transmission line 40 to the clocking input of flip-flop FF2. Those in the art will appreciate that about 1 ns of time delay is introduced for each 9 inches or so of a typical coaxial cable due to the finite speed of signal transmission therealong.

In the exemplary embodiment, conventional coaxial cable connectors may typically be provided in conjunction with the microstrip transmission line so as to permit the connection of any desired "off board" length of coaxial cables 28, 38. In the exemplary embodiment, it has been observed that the abosolute magnitudes of time delay T1 and T2 (which in the exemplary embodiment are equal) are not overly critical. Equal time delays T1 and T2 of approximately 2, 5 and 10 nanoseconds have been employed with substantially equivalent improved results using carrier frequencies of 30 MHz or 60 MHz for the REF and SIG signals.

As depicted in FIG. 2B, it will be seen that if the intermediate signals S1, S2 from the first channel comparator 20 are directly differenced (to provide a conventional type of single channel output), a somewhat lengthened phase measurement would result. On the other hand, if the traditional intermediate signals S3, S4 from the second channel comparator 22 are directly differenced, then a somewhat shortened phase measurement would result. However, if such lengthened and shortened phase measurements are averaged together, then the resulting composite phase measurement (e.g., represented by the average magnitude of the analog output signal) still corresponds to the true or actual phase difference to be measured. As used throughout this disclosure, it is understood that the terms "lengthened" and "shortened" apply to the duration of the pulses out of flip-flops in the exemplary embodiment. For ease of illustration, the S1, S2, S3 and S4 outputs have been graphed in FIG. 2B. However, as explained below, these signals are perferably low pass filtered before combination and thus the actual composite output signal will not exhibit the same sharply squared waveform as here illustrated.

While it would certainly be possible to perform the traditional S1–S2 difference in the first channel comparator, to then perform the traditional S3–S4 difference in the second channel and then to sum the resulting pair of difference signals for the final composite output, the exemplary embodiment has performed the same algebraic signal combination in a slightly different manner so as to require only one differencing amplifier. For example, as shown in FIG. 2A, signals S1 and S3 are first summed at node 50 and buffered by amplifier 52 before being input to the positive input of differencing amplifier 54. At the same time, signals S2 and S4 are summed at node 56, buffered by amplifier 58 and input to the negative input of amplifier 54 so as to produce a resultant signal which still has an average value proportional to the desired actual phase difference between signals REF and SIG.

As those in the art will appreciate, it is difficult to exactly match the salient characteristics of a pair of differencing operational amplifiers (i.e., one in each channel). Attempts to do so typically involve multiple operational amplifiers or other techniques. Accordingly, the exemplary embodiment minimizes such problems and/or expense by interleaving the intermediate channel outputs so as to require only one differencing amplifier.

It will also be understood that a form of "master reset" circuit may be employed, if desired, so as to hold the flip-flops FF1–FF4 (and any other desired circuitry in any particular given application) in a predetermined fixed state of readiness (e.g., FF1–FF4 all "reset") until automatically released upon some predetermined occurrence to establish a particular starting phase (e.g., the first detected transition in one of the REF or SIG inputs). Such additional master reset or initializing circuits are not here shown so as to avoid unnecessary complications in understanding more basic operations of the plural channel phase-comparator itself.

As also depicted in FIG. 2A, conventional low pass filters 60, 62, 64 and 66 are provided for conventional purposes. Namely, to filter out the higher frequency carrier frequency (e.g., the 30 or 60 MHz frequency of REF and SIG signals in the exemplary embodiment) while still passing the desired bandwidth of phase modulation to be measured (e.g., perhaps a 15–20 KHz bandwidth of phase modulation on a 30 MHz carrier frequency in the exemplary embodiment). Conventional one or multiple pole RC low pass filter circuits may be employed as will be appreciated by those in the art.

Although the D inputs of flip-flops FF1, FF2, FF3 and FF4 are depicted in FIG. 2A as being fixedly connected to a "high" logic signal level H, they may actually be controllably provided with such a "high" logic level signal by the output of a suitable logic gate (not shown). For example, the output of a NAND gate might be employed such that when the gate is properly driven by a carrier envelope detector, the requisite high logic level is provided to the D inputs of the flip-flops in the phase comparator circuits. On the other hand, if the carrier envelope detector output disappears, then the NAND gate would automatically disable the flip-flops and the phase comparators and drive the output of the phase comparator to a consistent zero level. The previously mentioned master reset or initialization circuit might also, at least in part, drive such a gate-controlled input to the D terminals as should now be appreciated.

Figure 3A:
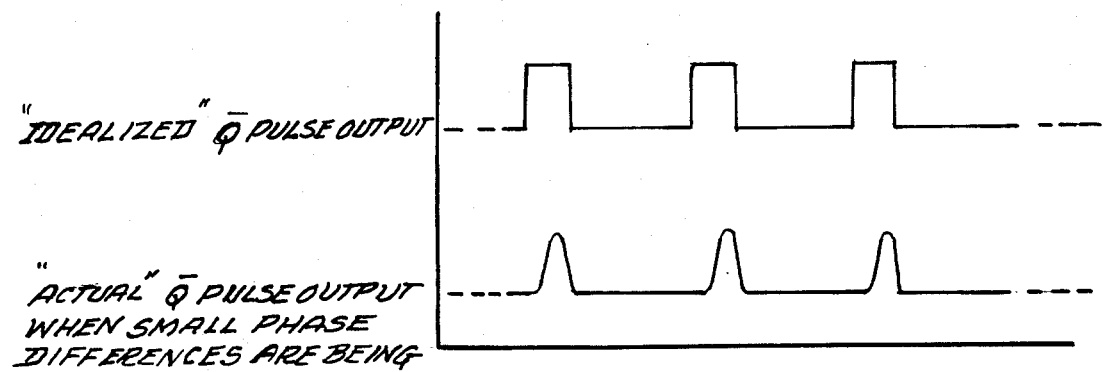
FIGS. 3A and 3B are graphs useful in explaining typical inaccuracies that can sometimes occur in the circuit of FIG. 2A when relatively small phase differences are being measured.
Figure 3B:
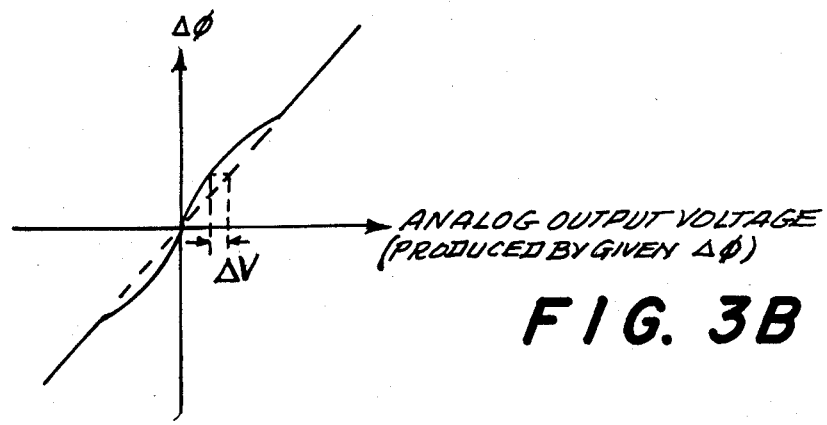

As depicted in FIG. 3A, the idealized $\overline{Q}$ pulse output of the flip-flops (proportional in time duration to the measured phase difference) is theoretically a very nice square-shaped waveform. In actuality, especially when relatively small phase differences are being measured (e.g., corresponding to relatively short duration pulses), the actual $\overline{Q}$ pulse output may be of relatively irregular shape at its leading/trailing edges as also depicted in FIG. 3A. As should now be appreciated, the analog voltage output of the phase comparator in FIG. 2A depends on a time average of the area under such pulse shapes. Accordingly, when relatively small phase differences are being measured, such irregularities can give rise to significant non-linearities in the overall transfer characteristic of the phase comparator (as depicted in FIG. 3B).

Figure 4:
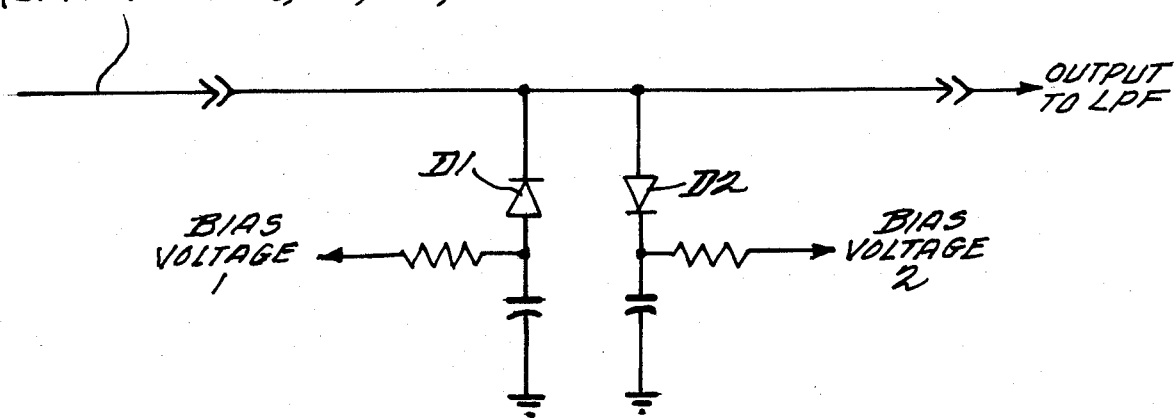
FIG. 4 is a schematic diagram of an improved additional bi-polar voltage clamp circuitry that may be added to the circuit of FIG. 2A to improve its overall operation when relatively small phase differences are being measured.

To help improve the circuit operation when such small phase differences are involved, a bi-polar voltage clamp may be employed at each of the $\overline{Q}$ output terminals of the flip-flops FF1–FF4 as depicted in FIG. 4. The operation of such a clamp serves to fix the maximum amplitude of the actual $\overline{Q}$ logic pulses so that relatively slow rise time characteristics (e.g., sloped leading edges) are, in effect, "squared off". Since the whole period of the pulse/no pulse is being clamped, the relative proportionality of the resulting time-averaged signal is maintained so that, except for a possible constant scaling factor, the output of the phase comparator is not adversely affected. The use of such a bi-polar voltage clamp is intrinsically more practical to implement than attempting to improve the time responsiveness of all of the remainder of the circuitry so as to improve the reproducibility and/or "squareness" of the actual $\overline{Q}$ pulse outputs.

It should be understood that the $\overline{Q}$ output pulses of the flip-flops in the circuit of FIG. 2A are triggered "on" by the leading edges of one input signal and triggered "off" by the leading edge of a second input signal. Accordingly, the maximum possible duration of an output $\overline{Q}$ pulse is the period of the reference input signal. In effect, the low pass filtering and algebraic combination circuits then cause the area of a single output pulse to be compared to the overall potential pulse area for the referenced period so as to yield an analog signal output having a magnitude proportional to the phase difference. The absolute amplitude of the output pulses is, however, arbitrary since the proportionality of the pulse to the total period is maintained regardless of pulse height. This feature then permits the use of the voltage clamp as shown in FIG. 4 so as to conveniently improve the linearity of the overall phase comparator transfer curve near the "zero point" when relatively small differences are involved.

Although only one presently preferred embodiment of the invention has been explained in detail, those skilled in this art will recognize that there are many possible variations and modifications which may be made in this exemplary embodiment while still retaining many of the advantageous and novel features of this invention. For one non-limiting example, additional phase comparator channels may be added to the system so that a greater number of measurements are taken and averaged together to produce the composite phase measurement output. Accordingly, all such variations and modifications are intended to be included within the scope of the appended claims.

I claim:

1. A phase comparator for measuring the relative phase difference between first and second electrical signals, said phase comparator comprising:
   a first channel phase comparator means for producing a lengthened phase difference output representing a greater than actual phase difference between said first and second signal;
   a second channel phase comparator means for producing a shortened phase difference output representing a less than actual phase difference between said first and second signals; and
   combining means connected to receive said lengthened phase difference output and said shortened phase difference output and to produce an average thereof as a composite output representing the actual phase difference between said first and second signals.

2. A phase comparator as in claim 1 wherein:
   said first channel phase comparator means produces a pair of output signals S1, S2 with S1–S2 representing said lengthened phase difference output;
   said second channel phase comparator means produces a pair of output signals S3, S4 with S3–S4 representing said shortened phase difference output; and
   said combining means produces said composite output which is proportional to $|(S1+S3)-(S2+S4)|$.

3. A phase comparator as in claim 1 further comprising:
   voltage clamp means connected to the output of each phase comparator means for "squaring up" the leading/trailing edges of output pulse signals appearing thereat and thereby improving the accuracy of said composite output when relatively smaller phase differences are being measured.

4. A phase comparator as in claim 2 further comprising:
   voltage clamp means connected to the output of each phase comparator means for "squaring up" the leading/trailing edges of output pulse signals appearing thereat and thereby improving the accuracy of said composite output when relatively smaller phase differences are being measured.

5. A phase comparator as in claim 2 wherein said combining means includes only a single differencing amplifier.

6. A phase comparator as in claim 1 wherein each of said first and second channel phase comparator means includes time delay means for delaying one of two signals input thereto by substantially the same predetermined time delay.

7. A phase comparator as in claim 1 wherein said first and second phase comparator means include:
   first delay means for providing a time-delayed first signal;
   second delay means for providing a time-delayed second signal;
   first comparator means connected to said second delay means for comparing said first signal with said delayed second signal and for providing a first output signal having a greater than actual phase difference between said first and second signal;
   second comparator means connected to said first delay means for comparing said delayed first signal with said second signal and for providing a second output signal having a less than actual phase difference between said first and second signal; and
   said combining means are connected to said first and second comparator means for combining said first and second output signals and producing a composite output signal representing the relative phase difference between said first and second signals.

8. A phase comparator as in claim 7 wherein said first and second time delay means each provides an approximately equal respective time delay.

9. A phase comparator as in claim 7 wherein said first and second comparators each comprises:
   a pair of bi-stable means each having a respective triggering input connected to receive one of the signals to be compared and providing respective binary logic outputs during time durations which correspond to the time difference between occurrence of similar portions of the signals to be compared.

10. A phase comparator as in claim 9 wherein:
    each of said bi-stable means comprises a D-type flip-flop having a D-input connected enabling the flip-flop to be transitioned upon a predetermined clocking input;
    said first comparator means includes first and second D-type flip-flops FF1 and FF2, said first flip-flop FF1 having a clocking input connected to receive an undelayed first signal and said second flip-flop FF2 having a clocking input connected to receive said delayed second signal, FF1 and FF2 having predetermined logic outputs connected to automatically reset FF1 and FF2 to predetermined starting states upon the transitioning of both FF1 and FF2 and also having predetermined logic outputs connected to provide as said first output signal a pair of signals S1 and S2; and
    said second comparator means includes third and fourth D-type flip-flops FF3 and FF4, said third flip-flip FF3 having a clocking input connected to receive said delayed first signal and said fourth flip-flop FF4 having a clocking input connected to receive an undelayed second signal, FF3 and FF4 having predetermined logic outputs connected to automatically reset FF3 and FF4 to predetermined starting states upon the transitioning of both FF3 and FF4 and also having predetermined logic outputs connected to provide as said second output signals pair of signals S3 and S4.

11. A phase comparator as in claim 10 wherein said combining means comprises:
    low pass frequency filtering means for individually low pass frequency filtering said signals S1, S2, S3 and S4; and sum/difference circuit means connected to receive the low pass filtered S1, S2, S3 and S4 signals and to provide an analog signal approximately equal in average magnitude to $|(S1-S2)+(S3-S4)|$.

12. A phase comparator as in claim 9 wherein at least the binary logic outputs of bi-stable means each include pulse voltage clamp means connected thereto for limiting the maximum amplitude of logic pulses thereon to a predetermined value thus improving the linearity of the final output phase measurement when small phase differences are being measured.

13. A phase comparator as in claim 12 wherein said sum/difference circuit means includes only one differencing amplifier.

14. A phase comparison method for measuring the relative phase difference between first and second electrical signals, said phase comparison method comprising:
producing a lengthened phase difference output representing a greater than actual phase difference between said first and second signal;
producing a shortened phase difference output representing a less than actual phase difference between said first and second signals; and
combining said lengthened phase difference output and said shortened phase difference output to produce an average thereof as a composite output representing the actual phase difference between said first and second signals.

15. A phase comparison method as in claim 14 wherein:
said first producing step produces a pair of output signals S1, S2 with S1–S2 representing said lengthened phase difference output;
said second producing step produces a pair of output signals S3, S4 with S3–S4 representing said shortened phase difference output; and
said combining step produces said composite output which is proportional to $|(S1+S3)-(S2+S4)|$.

16. A phase comparison method as in claim 14 further comprising:
"squaring up" the leading/trailing edges of output pulse signals appearing at the output of each producing step and thereby improving the accuracy of said composite output when relatively smaller phase differences are being measured.

17. A phase comparison as in claim 15 further comprising:
"squaring up" the leading/trailing edges of output pulse signals appearing at the output of each producing step and thereby improving the accuracy of said composite output when relatively smaller phase differences are being measured.

18. A phase comparison method as in claim 15 wherein said combining step includes only a single differencing process.

19. A phase comparison method as in claim 14 wherein each of said producing steps includes the step of time delaying one of the two signals used therein by substantially the same predetermined time delay.

20. A phase comparison method as in claim 14 wherein said steps of producing lengthened and shortened phase difference outputs include:
providing a time-delayed first signal;
providing a time-delayed second signal;
comparing said first signal with said delayed second signal and providing a first output signal corresponding to the phase difference therebetween and having a greater than actual phase difference between said first and second signal;
comparing said delayed first signal with said second signal and providing a second output signal corresponding to the phase difference therebetween and having a less than actual phase difference between said first and second signal; and
said combining step includes combining said first and second output signals.

21. A phase comparison method as in claim 20 wherein said first and second time delayed signals are each subjected to an approximately equal respective time delay.

* * * * *